United States Patent [19]
Yamada

[11] Patent Number: 6,084,539
[45] Date of Patent: Jul. 4, 2000

[54] DIGITAL TO ANALOG CONVERTER

[75] Inventor: Takaaki Yamada, Kanagawa, Japan

[73] Assignee: Sony Corporation, Tokyo, Japan

[21] Appl. No.: 09/086,477

[22] Filed: May 28, 1998

[30] Foreign Application Priority Data

Jun. 2, 1997 [JP] Japan ................................ 9-144185

[51] Int. Cl.[7] .................................................. H03M 1/12
[52] U.S. Cl. .......................... 341/155; 348/505; 348/538
[58] Field of Search ..................................... 341/155, 141

[56] References Cited

U.S. PATENT DOCUMENTS

| | | | |
|---|---|---|---|
| 4,647,968 | 3/1987 | Willis | 341/155 |
| 4,703,340 | 10/1987 | Balaban | 341/155 |
| 4,774,577 | 9/1988 | Takimoto | 341/155 |
| 4,958,156 | 9/1990 | Ando et al. | 341/155 |
| 5,014,055 | 5/1991 | Dingwall et al. | 341/155 |
| 5,126,742 | 6/1992 | Schmidt et al. | 341/155 |
| 5,324,995 | 6/1994 | Yee | 341/155 |
| 5,325,093 | 6/1994 | Takamori | 341/155 |
| 5,387,913 | 2/1995 | Park et al. | 341/155 |

Primary Examiner—Howard L. Williams
Assistant Examiner—Jean B. Jeanglaude
Attorney, Agent, or Firm—Ronald P. Kananen; Rader, Fishman & Grauer

[57] ABSTRACT

An analog signal, for example, a video signal is divided into a high frequency signal and a low frequency signal by a high-pass filter and a low-pass filter. A high speed analog-to-digital converter (ADC) converts the high frequency signal to a first digital code while a low speed but high precision ADC converts the low frequency signal to a second digital code. A synthesizer combines the first and second digital codes and outputs a digital code as the result of the conversion. Therefore, analog-to-digital conversion with a high speed, high precision, and high resolution can be realized.

16 Claims, 9 Drawing Sheets

DIGITAL TO ANALOG CONVERTER

BACKGROUND OF THE INVENTION

1. Field of the Invention

The present invention relates to an analog-to-digital converter, for example, an analog-to-digital converter used in a video apparatus such as a digital video camera for converting video signals to digital signals.

2. Description of the Related Art

Various kinds of analog-to-digital converters for converting analog signals to digital signals have been developed in response to demands for higher operating speeds, higher resolution, that is, larger numbers of converted bits, etc. Particularly, in the case of digitization of a video signal, since a high speed, high accuracy, and a resolution of more than 10 bits are required, at the present time flash type and/or sub-ranging type analog-to-digital converters are generally used.

FIG. 1 is a circuit diagram of an example of a flash type analog-to-digital converter. As illustrated, the converter of this example is constituted by 16 cascade-connected resistors R1 to R16 connected between reference voltages VRT and VRB, 15 comparators C1 to C15, a sample and hold circuit 110, and an encoder 108.

The resistors R1 to R16 having the same resistance values generate reference voltages by dividing equally the difference of the reference voltages VRT and VRB and supply the divided reference voltages to the comparators. Note that, for example, the difference of the reference voltages VRT and VRB is set as equal to a full scale voltage of the analog-to-digital converter.

An input analog signal Vin is sampled and held by the sample and hold circuit 110. The held signal is supplied to the comparators. Each of the comparators C1 to C15 compares the level of the reference voltage from each of the connection nodes of the resistors and the analog signal from the sample and hold circuit 110 and outputs binary signal in response to the result of the comparison. For example, if the level of the analog signal is higher than that of the reference voltage, a comparator outputs a high level signal representing the data "1", while if the level of the analog signal is lower than that of the reference voltage, the comparator outputs a low level signal representing the data "0".

In this way, a string of data constituted by a plurality of data "0" and "1" is output by the series of comparators according to the input analog signal Vin. The string of data is input to the encoder 108 and converted to a binary number of predetermined number of bits. In the circuit of FIG. 1, the reference voltages are generated by dividing equally the full scale of the input analog signal Vin into 16 parts, so a 4-bit digital code can be obtained.

Such a flash type analog-to-digital converter converts a digital code of a predetermined number of bits according to the level of the input analog signal Vin. Since a plurality of comparators are used for parallel comparison, the bits of the digital code Dout can be obtained all at once. Therefore, high speed conversion can be achieved. For this reason, this type of converter is called a parallel comparison type or flash type converter. The accuracy of this type analog-to-digital converter is affected by the resistance of the resistors dividing the reference voltages and the fluctuations in the offsets of the comparators.

Another type of analog-to-digital converter used for the digitization of video signals is the subranging type analog-to-digital converter shown in FIG. 2. As illustrated, a sub-ranging analog-to-digital converter is constituted by a sample and hold circuit 110, an analog-to-digital converter (ADC) 120, a digital-to-analog converter (DAC) 130, an adder 140, an ADC 150, and a synthesizer 160.

An input analog signal Vin is sampled and held by the sample and hold circuit 110. The held signal is converted to an m-bit digital code Dm and output to the DAC 130 and the synthesizer 160.

The DAC 130 generates an analog signal Sm having a level changing in response to the input digital code Dm. The adder 140 finds a difference of the held signal of the analog signal Vin from the sample and hold circuit 110 and the analog signal Sm from the DAC 130 and outputs a difference signal Sn.

The ADC 150 converts and outputs an n-bit digital code Dn in response to the level of the difference signal Sn. Then the synthesizer 160 combines the m-bit digital code Dm from the ADC 120 and the n-bit digital code from the ADC 150 and outputs an (m+n)-bit digital code Dout.

In this way, in the sub-ranging type analog-to-digital converter of this example, the ADC 120 outputs the upper m-bit digital code, while the ADC 150 outputs the lower n-bit digital code. The synthesizer 160 combines the upper m bits and the lower n bits and outputs the (m+n)-bit digital code Dout as the final result of the conversion.

The analog-to-digital converters described above, however, suffer from a tradeoff between the operating speed and resolution. There was therefore the problem that a converter capable of satisfying all of the requirements was hard to realize.

For example, a flash type analog-to-digital converter is capable of realizing high speed operation, but requires a plurality of resistors for dividing the voltage and a plurality of comparators. The number of the elements constituting the circuit becomes larger the larger the number of bits and therefore an increase of the layout area was unavoidable. At the present time, actual converters made by integrated circuits (IC) are about 8- to 10-bit types.

Further, the number of the resistors and comparators increases along with the increase of the number of bits. The variations in the elements are also becoming worse. In practice, the deterioration of the accuracy due to variations in the offsets of the comparators has become a bigger problem than that due to variations in the resistances of the resistors. As a result, it is difficult to build a converter of more than 10 bits capacity with a high yield.

In a sub-ranging type analog-to-digital converter, the ADC 120 that outputs the upper m-bit digital code Dm and the DAC for converting that to an analog signal must have a precision of the final result of (m+n) bits of the conversion. Further, a high precision of the adder for performing the subtraction is also required. For this reason, it is difficult to build a sub-ranging type analog-to-digital converter of more than 10 bits capacity with a high yield.

In recent years, along with the digitalization of video apparatuses, the need for analog-to-digital converters for converting video signals has become greater. Considering the frequency characteristic and the dynamic range of video signals, analog-to-digital converters should have converting speeds of more than 20 MHz and resolutions of more than 10 bits. Furthermore, it is preferable to combine the analog-to-digital conversion and the signal processing. Therefore, there is a demand for an analog-to-digital converter having a converting speed of more than 20 MHz and a resolution of more than 10 bits by complementary metal oxide semiconductor (CMOS) circuits.

SUMMARY OF THE INVENTION

The present invention was made in consideration with this circumstance and has as an object thereof to provide an analog-to-digital converter having a high speed and high precision and able to handle a plurality of bits.

To achieve the above object, according to a first aspect of the present invention, there is provided an analog-to-digital converter outputting a digital signal in response to a level of an input signal, comprising a frequency band divider for dividing a frequency band of the input signal to n (n is an integer equal to or greater than 2) number of frequency bands, n number of converters for converting the n number of signals of the n number of frequency bands divided by the frequency band divider, each converter converting the corresponding frequency band signal at a frequency corresponding to the frequency band of the input frequency band signal, and a synthesizer for combining the n number of results of conversion by the n number of converters and outputting the combined result as one word conversion data for the input signal.

According to a second aspect of the present invention, there is provided an analog-to-digital converter outputting a digital signal in response to a level of an input signal, comprising a band extracting means for extracting predetermined frequency components from the input signal, a first converting means for converting a signal of the frequency components extracted by the band extracting means to a first digital signal, a second converting means for converting a signal of the remaining frequency components of the input signal to a second digital signal, and a synthesizer for combining the first and second digital signals and outputting the combined result as a result of conversion of the input signal.

BRIEF DESCRIPTION OF THE DRAWINGS

These and other objects and features of the present invention will become clearer from the following more detailed description of the related art and description of the preferred embodiments given with reference to the attached figures, in which.

DESCRIPTION OF THE PREFERRED EMBODIMENTS

First embodiment

Figure 3:
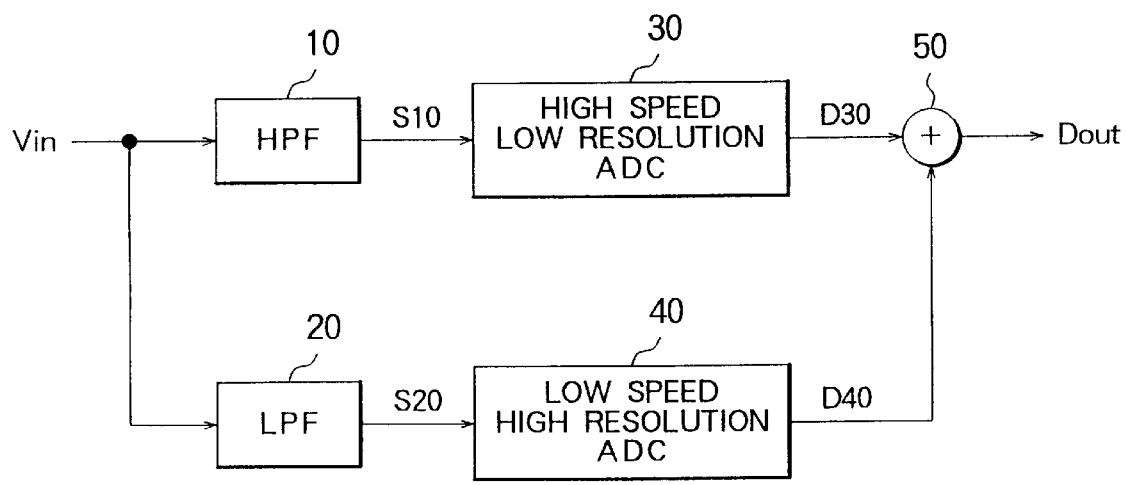
FIG. 3 is a circuit diagram of an analog-to-digital converter according to a first embodiment of the present invention.

FIG. 3 is a circuit diagram of an analog-to-digital converter according to a first embodiment of the present invention.

As illustrated, the analog-to-digital converter of this embodiment is constituted by a high-pass filter (HPF) 10, a low-pass filter (LPF) 20, an ADC 30, an ADC 40, and a synthesizer 50. Further, as illustrated, the ADC 30 is an analog-to-digital converter having a high speed and low resolution, while the ADC 40 is an analog-to-digital converter having a low speed and high resolution.

An analog signal Vin input from the outside is input to the high-pass filter 10 and the low-pass filter 20. The high-pass filter 10 extracts high frequency components S10 of the analog signal Vin and inputs the same to the ADC 30. The low-pass filter 20 extracts low frequency components S20 of the analog signal Vin and inputs the same to the ADC 40.

The ADC 30 and ADC 40 output digital codes D30 and D40 according to the level of the analog signal input.

The synthesizer 50 combines the digital codes D30 and D40 and outputs a digital code Dout as the result of the combination. Note that the digital code Dout is output as a result of the analog-to-digital conversion of the input analog signal Vin.

In the analog-to-digital converter of this embodiment, the input analog signal Vin is divided into the high frequency signal S10 and low frequency signal S20 by the high-pass filter 10 and the low-pass filter 20, respectively. The high frequency signal S10 is converted to the digital code D30 by the ADC 30, while the low frequency signal S20 is converted to the digital code D40 by the ADC 40. The digital codes D30 and D40 are combined by the synthesizer 50, and the result of the combination, that is, the digital code Dout, is output as a result of the conversion of the analog signal Vin.

Figure 4:
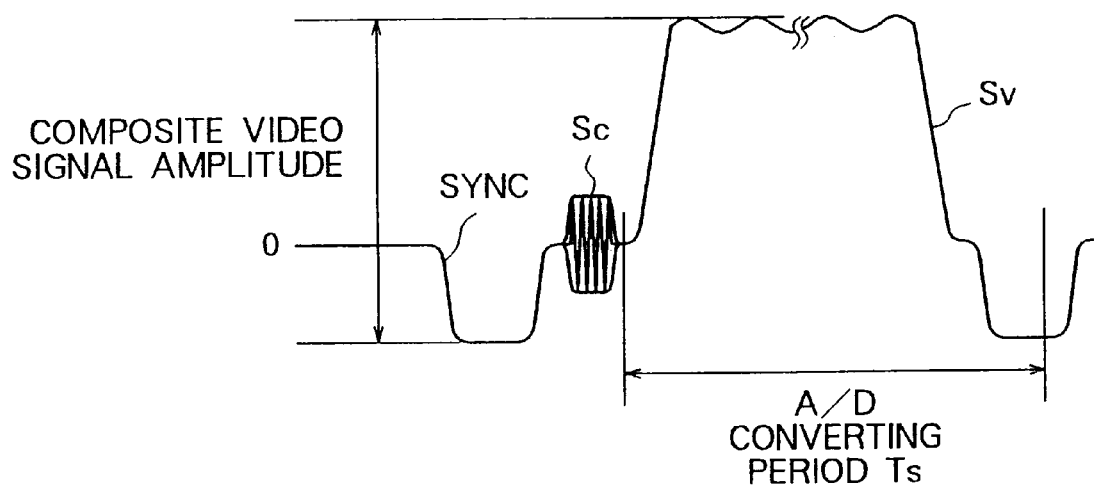
FIG. 4 is a waveform diagram of an analog signal of a composite video signal.

The input analog signal Vin is, for example, a composite video signal obtained from a video apparatus. FIG. 4 shows an example of a composite video signal. As shown in FIG. 4, the composite video signal comprises a synchronization signal SYNC, a video signal Sv, and a color burst signal Sc. The synchronization signal SYNC is formed by, for example, a negative pulse signal controlling the horizontal and vertical synchronization in a video signal display apparatus. The color burst signal So provides a phase reference of a color subcarrier for reproducing color signals in the display apparatus. Note that in FIG. 4, the color subcarrier which is combined in the video signal Sv is not illustrated.

The video signal Sv is a signal having a level in accordance with the luminance of an image. The video signal Sv is obtained by converting the optical image of an object to electric signals by an imaging apparatus such as a video camera. Further, in a television receiver, a composite video signal including a video signal Sv is output from a detector.

In FIG. 4, as an example of a synchronization signal SYNC, a horizontal synchronization signal is shown. The interval between two horizontal synchronization signals is a horizontal period described as 1H. As for the NTSC television signal, 1H is 63.5 ps. Further, in this system, the frequency of the color burst signal Sc is 3.58 MHz. In a broadcast signal of the NTSC system, the spectrum of the video signal Sv is distributed in a band spread from the direct current (DC) component to about 4.5 MHz.

Figure 5:
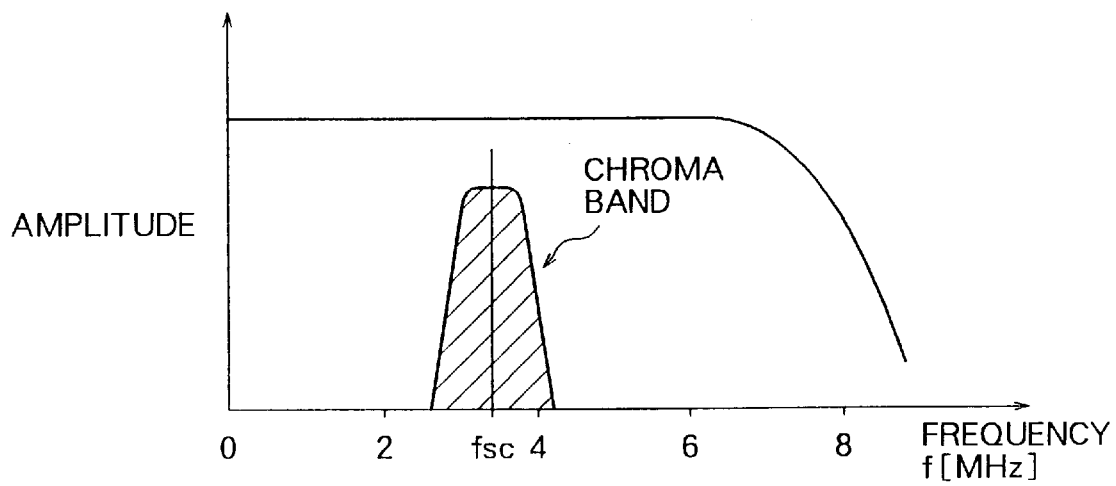
FIG. 5 is a diagram of a spectrum of a video signal.

In the imaging apparatus such as a video cameras, the frequency bands of the video signals differ from each other according to the application. For example, the frequency components of a video signal in a commercial use video camera has a span spreading from the DC component to 10 MHz, while the frequency components of a video signal in a consumer use video camera has a span spreading from the DC component to about 6 to 7 MHz. FIG. 5 shows an example of a spectrum of a video signal. As illustrated, the frequency spectrum of the video signal of this example is distributed from the DC component to 7 MHz and fades rapidly at a frequency band higher than 7 MHz.

Further, as illustrated in FIG. 5, the frequency band centered around the central frequency fsc of the color burst signal Sc from fsc−500 kHz to fsc+500 kHz is the chroma band.

In an imaging apparatus such as a digital video camera, it is necessary to convert such a video signal to a digital signal, for example, in the analog-to-digital (A/D) converting period Ts shown in FIG. 4, that is, to quantize the video signal.

Considering the visual characteristic of the human eye, that is, the decrease of the sensitivity at high frequency, when quantizing a video signal, it is possible to quantize the high frequency components at a low resolution and quantize the low frequency components at a high resolution.

Therefore, in the analog-to-digital converter according to the present embodiment, the video signal is divided into low frequency components and high frequency components. The low frequency components, for example, the frequency components below 1.5 MHz, are converted by an analog-to-digital converter with a high precision and high resolution, that is, to multiple bits, while the high frequency components, for example, the frequency components above 1.5 MHz are converted by an analog-to-digital converter with a high speed but a low precision and low resolution. Further, preferably, the chroma band is not divided when dividing the frequency band.

Based on the above requirements, the analog-to-digital converter according to the present embodiment has the configuration as shown in FIG. 3. The input analog signal Vin is divided into a plurality of frequency bands, for example, two frequency bands. The divided signals obtained are converted respectively. The final result of the analog-to-digital conversion is obtained by the synthesizer combining the results of the conversion.

Figure 6:
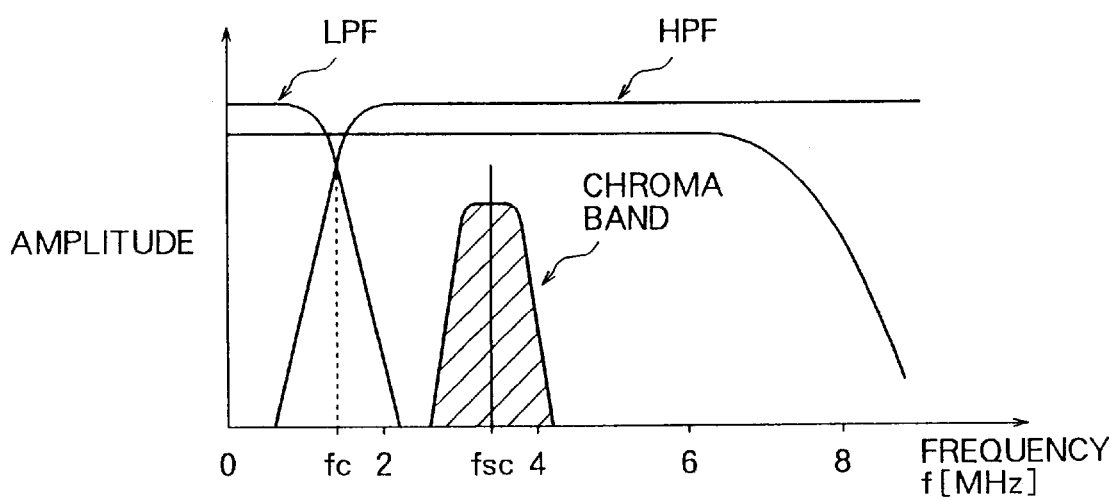
FIG. 6 are diagrams of a spectrum of a video signal and gain characteristics of a high-pass filter and a low-pass filter.

The frequency bands of the analog signal Vin are divided by the high-pass filter 10 and the low-pass filter 20 shown in FIG. 3. FIG. 6 shows a spectrum of the video signal and the gain characteristics of the high-pass filter 10 and the low-pass filter 20.

As illustrated, the gain of the high-pass filter 10 is held substantially level above a cutoff frequency fc and fades rapidly below the cutoff frequency fc. That is, the high-pass filter 10 allows the frequency components above the cutoff frequency to pass substantially intact while attenuates the frequency components below the cutoff frequency fc.

The gain of the low-pass filter 20 is held substantially level below the cutoff frequency fc and fades rapidly above the cutoff frequency fc. That is, the low-pass filter 20 allows the frequency components below the cutoff frequency to pass substantially intact while attenuates the frequency components above the cutoff frequency fc.

By setting the cutoff frequency fc at, for example, 1.5 MHz, as illustrated, the video signal can be divided into two frequency bands of 0 to 1.5 MHz and above 1.5 MHz without dividing the chroma band. Below, the band of the frequencies 0 to 1.5 MHz is described as the low frequency band while the band of the frequencies above the 1.5 MHz is described as the high frequency band.

As illustrated in FIG. 3, the signal S10 of the high frequency band is converted to digital code D30 by the ADC 30, while the signal S20 of the low frequency band is converted to digital code D40 by the ADC 40.

As described above, high speed conversion is required in the high frequency band while high precision is not required. On the other hand, in the low frequency band, low speed conversion is sufficient but a high precision is necessary.

In accordance with these requirements, the ADC 30 is formed by an analog-to-digital converter with a high speed but a low resolution, while the ADC 40 is formed by an analog-to-digital converter with a low speed but a high resolution.

Figure 1:
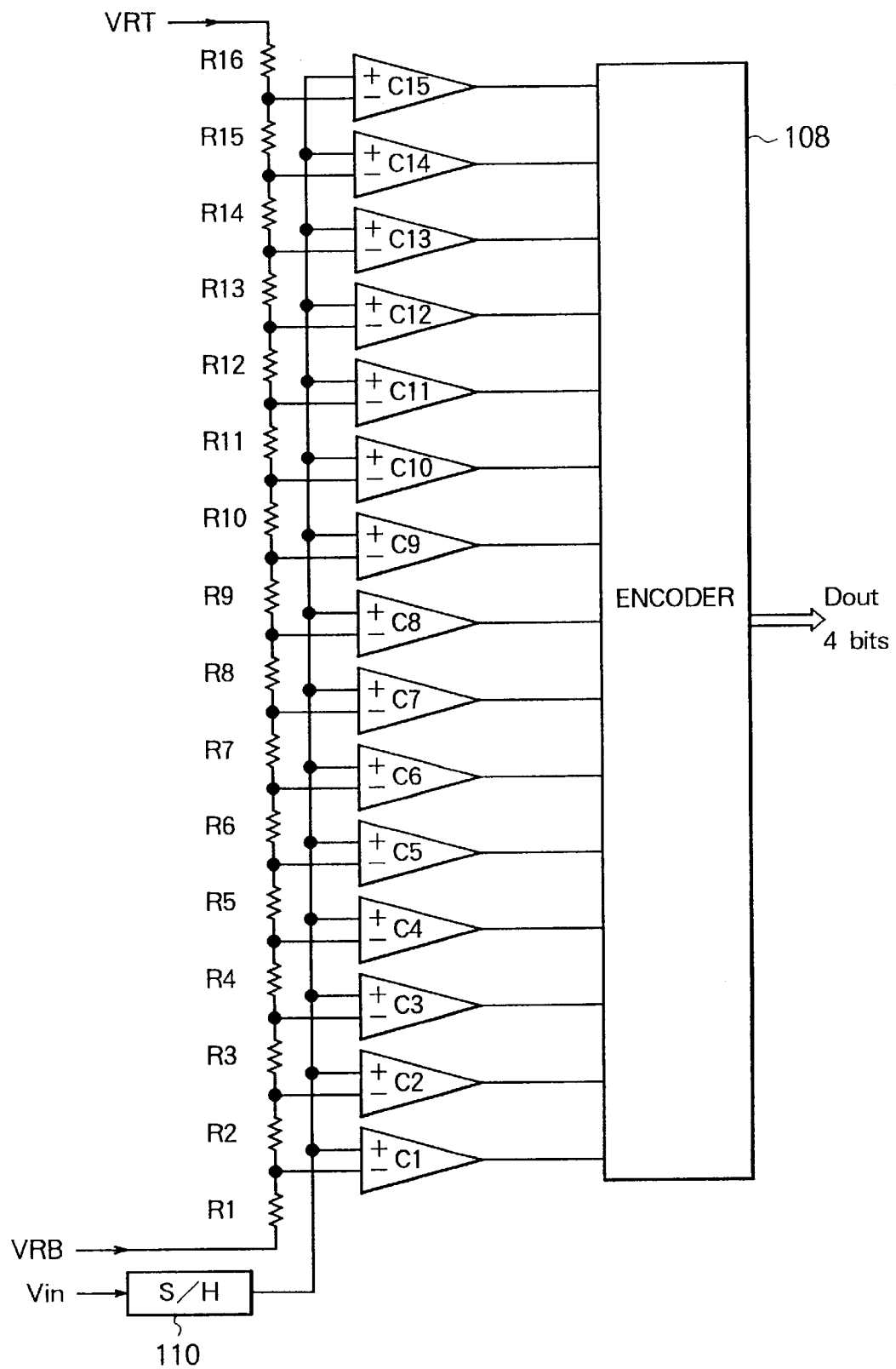
FIG. 1 is a circuit diagram of a general flash type analog-to-digital converter of the related art.
Figure 2:
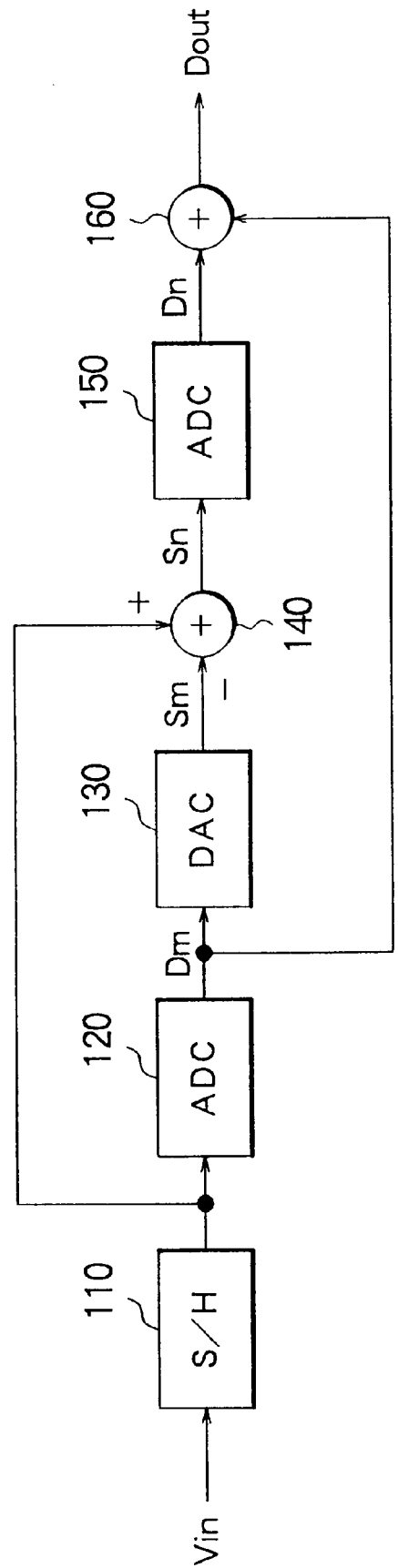
FIG. 2 is a circuit diagram of a general sub-ranging type analog-to-digital converter of the related art.

The ADC 30 is formed by a converter converting at a high speed, but a high precision and high resolution are unnecessary. That is, the number of bits of the digital code D30 can be small. For example, the flash type analog-to-digital converter as shown in FIG. 1 can be used. In this case, a resolution of 8 bits is sufficient.

As the ADC 40, low speed conversion is sufficient, but a high precision and high resolution are necessary. One of the examples of the analog-to-digital converter which can realize this is the consecutive comparison type analog-to-digital converter shown in FIG. 7.

Figure 7:
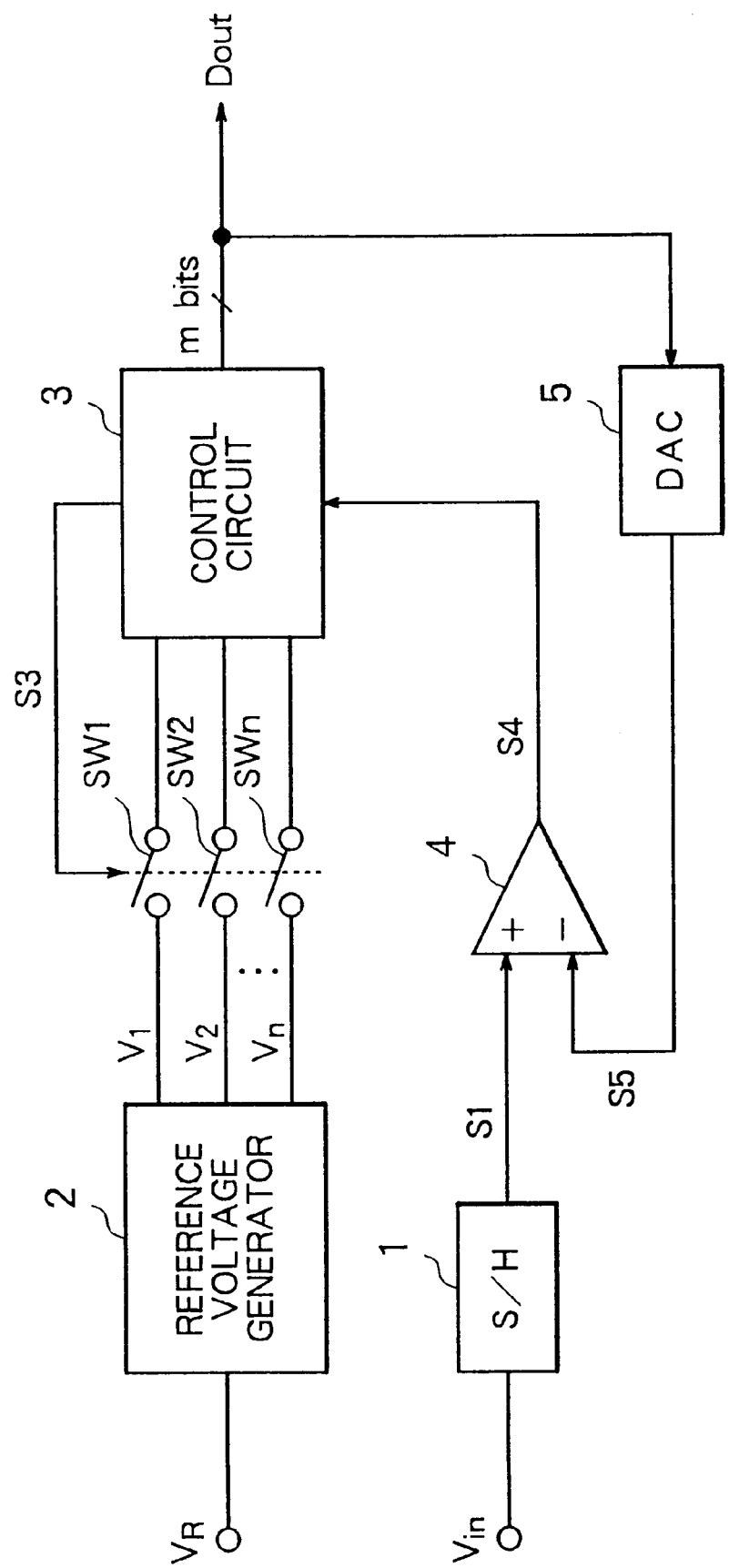
FIG. 7 is a block diagram of a consecutive comparison type analog-to-digital converter.

As shown in FIG. 7, the consecutive comparison type analog-to-digital converter is constituted by a sample and hold circuit 1, a reference voltage generator 2, a control circuit 3, a comparator 4, and a DAC 5.

The sample and hold circuit 1 samples and holds an input analog signal Vin. The held signal S1 is output to the comparator 4.

The reference voltage generator 2 generates a plurality of, for example, n number of reference voltages V1, V2, . . . , Vn in response to an input voltage VR. Note that the voltage VR is set according to the full scale of the analog-to-digital converter.

The control circuit 3 outputs a control signal S3 controlling the on/off states of n number of switching elements SW1, SW2, . . . , SWn provided in accordance with the number of the reference voltages. The control circuit 3 outputs an m-bit digital code Dout in accordance with the control signal S3 and the result S4 of the comparison from the comparator 4. The digital code Dout is the result of conversion of the analog signal Vin.

The input analog signal Vin is sampled and held by the sample and hold circuit 1. The held signal S1 and the analog signal S5 from the DAC 5 are input to the comparator 4. A signal S4 showing the result of the comparison is output by the comparator 4 and input to the control circuit 3.

The control signal S3 is generated by the control circuit 3 according to which the on/off states of the switching elements SW1, SW2, . . . , SWn are controlled. The control circuit 3 determines the m-bit digital code Dout from the MSB to LSB successively in accordance with the control signal S3 and the result of the comparison S4 from the comparator 4. The digital code Dout is input to the DAC 5, and the analog signal S5 is converted by the DAC 5 and the result output to the comparator 4.

The consecutive comparison type analog-to-digital converter of this example has only one comparator in comparison to the flash type analog-to-digital converter. Also, deterioration of the precision due to the variation in the offset of comparators can be avoided. Therefore, the precision of conversion is determined by the precision of the reference voltages V1, V2, . . . , Vn generated by the reference voltage generator 2 and the precision of the DAC 5. Analog-to-digital conversion with a higher precision than that of the flash type analog-to-digital converter can therefore be realized.

Figure 8:
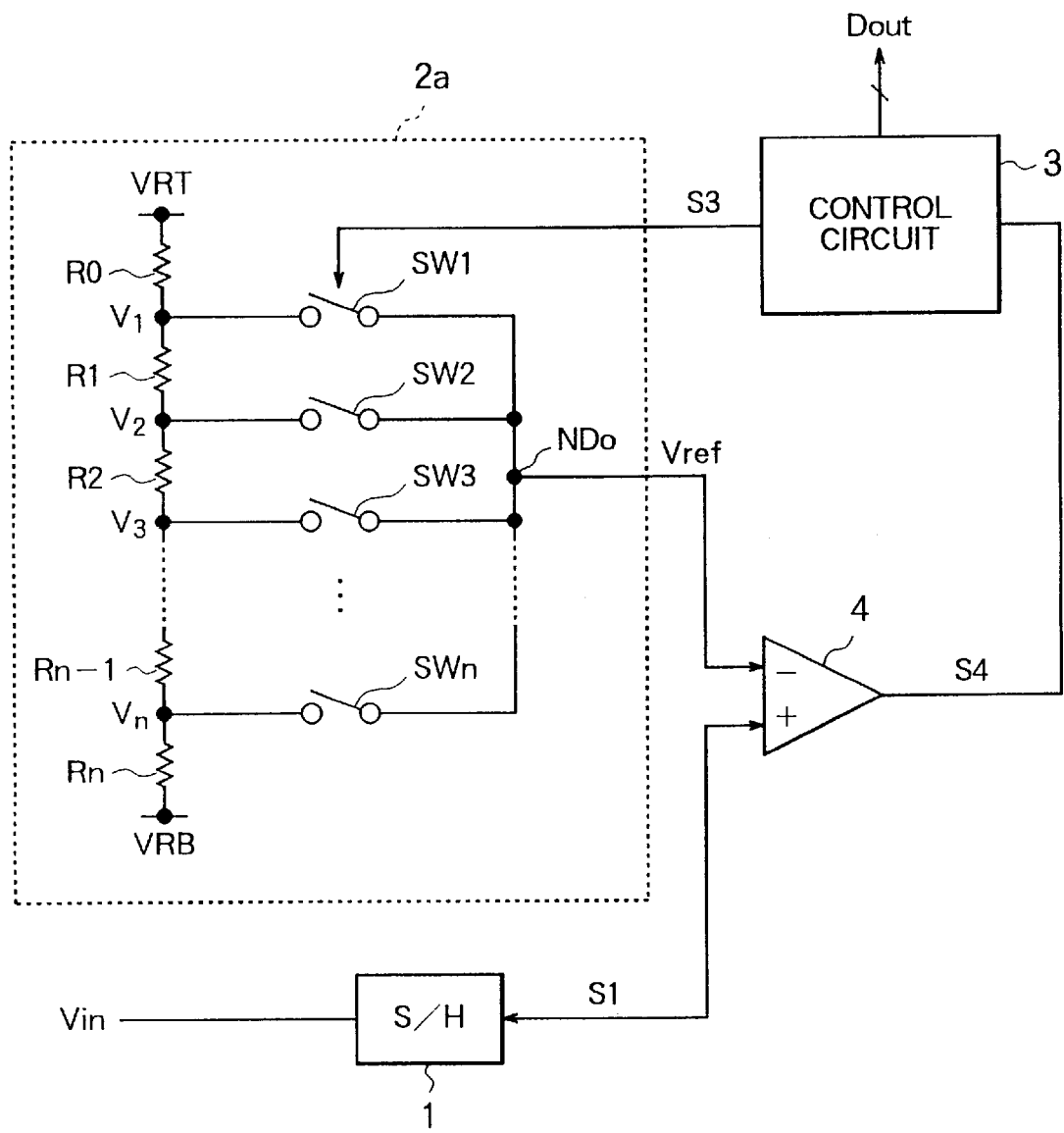
FIG. 8 is a circuit diagram of an example of a consecutive comparison type analog-to-digital converter.

FIG. 8 is a circuit diagram of an actual consecutive comparison type analog-to-digital converter. The analog-to-digital converter of this example is constituted by a sample and hold circuit 1, a reference voltage generator 2a, a control circuit 3, and a comparator 4.

As illustrated, in the consecutive comparison type converter of this example, the DAC 5 is omitted compared with the circuit shown by the block diagram of FIG. 7. Instead of this, the reference voltage Vref (Vref=V1, V2, . . . , Vn) generated by the reference voltage generator 2a is directly input to the comparator 4 and is compared with a signal S1 held by the sample and hold circuit 1.

The comparator 4 compares the levels of the held signal S1 and the reference voltage Vref and outputs a result S4 of the comparison to the control circuit 3.

The control circuit 3 outputs a control signal S3 controlling the on/off states of the switching elements SW1, SW2 . . . , SWn according to the result S4 of the comparison and further outputs a digital code Dout in accordance with the control signal S3 and the result S4 of the comparison from the comparator 4.

The reference voltage generator 2a is constituted by (n+1) number of resistors R0, R1, . . . , Rn and n number of switching elements SW1, SW2, . . . , SWn. The (n+1) number of resistors R1, R2, . . . , Rn cascade-connected between reference voltages VRT and VRB generate n number of reference voltages V1, V2, . . . , Vn. Note that the difference of the reference voltages VRT and VRB is set in accordance with the full scale of the analog-to-digital converter.

The switching elements SW1, SW2, . . . , SWn are connected between the connection points of the resistors and a node ND0. One of the reference voltages V1, V2, . . . , Vn is selected and output to the comparator 4 according to the on/off states of the switching elements.

Below, a detailed description of the consecutive comparison type analog-to-digital converter of this example will be given referring to FIG. 8.

In the consecutive comparison type analog-to-digital converter, the result of the comparison, that is, the digital code Dout, is determined successively from the MSB to the LSB.

First, a reference voltage equal to half of the full scale, for example, Vk, is selected by the control circuit 3 and output to the comparator 4 as the reference voltage Vref. The comparator 4 compares the held signal S1 held by the sample and hold circuit 1 and the reference voltage Vref. Here, for example, if the level of the held signal S1 is higher than that of the reference voltage Vref, a comparison signal S4 of a high level is output. If the level of the held signal S1 is lower than that of the reference voltage Vref, a comparison signal S4 of a low level is output. In the control circuit 3, the most significant bit of the digital code Dout, that is, the MSB, is determined according to the comparison signal S4. For example, when the comparison signal S4 is at a high level, the MSB is set to "1", while when the comparison signal S4 is at a low level, the MSB is set to "0".

After the MSB is determined, a lower bit, that is, the (MSB−1) bit, is determined. At this time, the control circuit 3 outputs control signal S3 controlling the switching elements SW1, SW2, . . . , SWn according to the data of the MSB. For example, if the MSB is "1", a reference voltage of ¾ of the full scale is selected and output to the comparator 4. If the MSB is "0", a reference voltage of ¼ of the full scale is selected and output to the comparator 4.

The (MSB−1) bit is determined according to the comparison signal S4 of the comparator 4. At this time, in the same way as the determination of the MSB, when the comparison signal S4 is at a high level, the (MSB−1) bit is set to "1", while when the comparison signal is at a low level, the (MSB−1) bit is set to "0".

By repeating the comparison and the bit determination as described above, the bits from the MSB to the LSB are all determined. In this way, by the consecutive comparison type analog-to-digital converter of this example, the comparison is performed by one comparator and the bits are determined from the MSB to the LSB. Therefore, deterioration of the precision due to variation in the offset of the comparator can be avoided. In this case, the precision of the conversion is substantially determined by the precision of the resistors for generating the reference voltage V1, V2, . . . , Vn. An analog-to-digital converter with a high precision can be realized by forming the resistors for voltage division with high accuracy.

As explained above, according to the present embodiment, there is provided an analog-to-digital converter wherein the analog signal Vin is divided into the high frequency signal S10 and the low frequency signal S20 by the high-pass filter 10 and the low-pass filter 20. The ADC 30 with a low speed but high resolution converts the high frequency signal S10 to the digital code D40, while the ADC 40 with a low speed but high resolution converts the low frequency signal 20 to the digital code D40. The synthesizer 50 combines the digital codes D30 and D40 and outputs the digital code Dout. Therefore, the input analog signal Vin can be converted to a digital signal with a high speed and high resolution.

Note that in above explanation, in the high frequency band, the flash type analog-to-digital converter is used for performing high speed analog-to-digital conversion, while in the low frequency band, the consecutive comparison type analog-to-digital converter is used for performing high accuracy conversion. The present embodiment is not however limited to this. It is clear that other analog-to-digital converters satisfying the requirements of quantization of the frequency bands can be used.

Second embodiment

Figure 9:
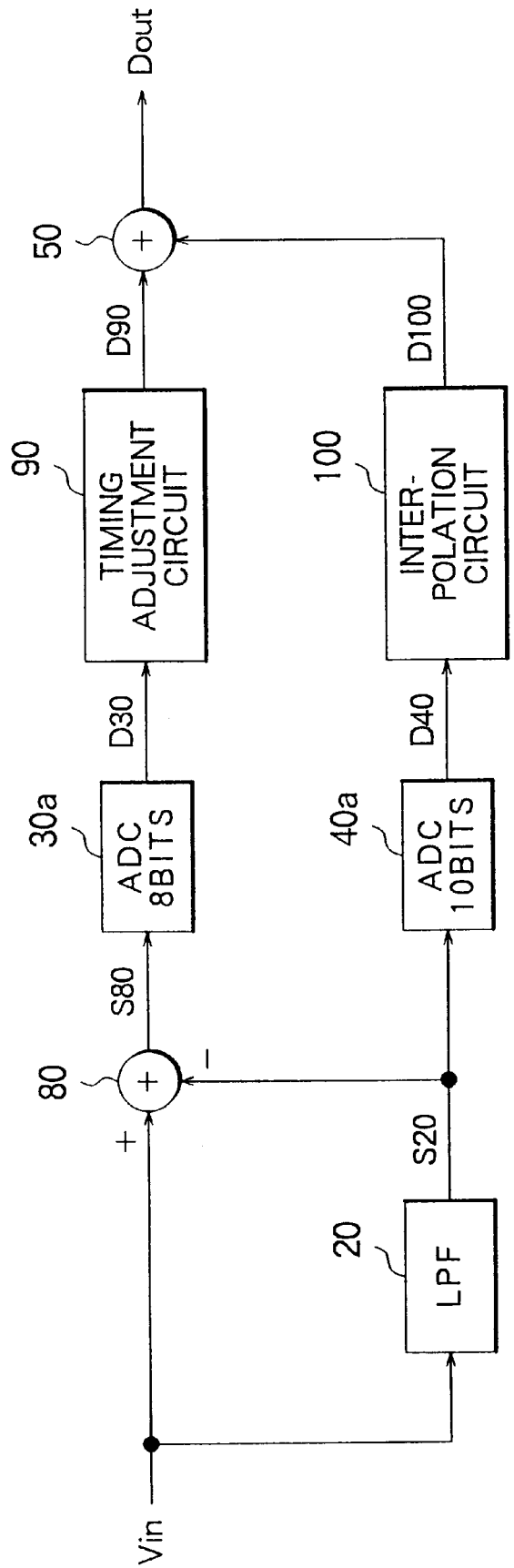
FIG. 9 is a circuit diagram of an analog-to-digital converter according to a second embodiment of the present invention.

FIG. 9 is circuit diagram of an analog-to-digital converter according to a second embodiment of the present invention.

As illustrated, the analog-to-digital converter of this embodiment is constituted by a low-pass filter 20, an ADC 30a, an ADC 40a, a synthesizer 50, an adder 80, a timing adjustment circuit 90, and an interpolation circuit 100.

The low-pass filter 20 is the same as that of the first embodiment shown in FIG. 3, which allows the passage of, for example, only frequency components below 1.5 MHz and attenuates the frequency components above that.

The ADC 30a is formed by, for example, an 8-bit analog-to-digital converter capable of high speed conversion but has a low precision and resolution. For example, the ADC 30a converts an input analog signal S80 to an 8-bit digital code D30 at a converting speed of 20 MSPS (mega samples per second).

The ADC 40a is formed by, for example, a 10-bit analog-to-digital converter which has a converting speed lower than that of the ADC 30a but is capable of converting with a high precision and high resolution. For example, the ADC 40a converts an input analog signal S20 to a 10-bit digital code D40 at a converting speed of 4 MSPS.

The timing adjustment circuit 90 is formed by, for example, a delay circuit which adjusts the timing of the digital code D30 from the ADC 30a and outputs the result D90 of the adjustment to the synthesizer 50.

The interpolation circuit 100 performs interpolation for the digital code D40 from the ADC 40a and outputs the result D100 of the interpolation to the synthesizer 50.

The adder 80 outputs a difference of the analog signal Vin and the output signal S20 of the low-pass filter 20. The adder 80 removes the low frequency components of the analog signal Vin, for example, the frequency components below 1.5 MHz. Only the frequency components above 1.5 MHz remain and are output to the ADC 30a as the signal S80.

In this embodiment, by using the low-pass filter 20 and the adder 80, the input analog signal Vin can be divided into the low frequency signal S20 having frequency components below 1.5 MHz and the high frequency signal S80 having frequency components above 1.5 MHz.

Here, the high-pass filter becomes unnecessary, but the adder 80 must have a uniform transfer characteristic from the frequency band below 1.5 MHz to frequency band above 1.5 MHz.

Below, the operation of the analog-to-digital converter of the present embodiment will be explained by referring to FIG. 9.

The input analog signal Vin is input to the low-pass filter 20 and the adder 80. By the low-pass filter 20, the low frequency components of the analog signal Vin, for example, the frequency components below 1.5 MHz, are extracted and output as the low frequency signal S20. The adder 80 outputs the difference of the analog signal Vin and the low frequency signal S20 from the low-pass filter 20. For this reason, the output signal S80 of the adder 80 only contains high frequency components of the analog signal Vin, for example, the frequency components above 1.5 MHz.

The high frequency signal S80 is converted to an 8-bit digital code D30 by the ADC 30a. On the other hand, the low frequency signal S20 is converted to the 10-bit digital code D40 by the ADC 40a. Here, the converting speed of the ADC 30a is made 20 MSPS, while the converting speed of the ADC 40a is made 4 MSPS. As a result, the ratio of the numbers of data of the digital codes D30 and D40 obtained from the ADC 30a and the ADC 40a at a unit time is 5:1. Further, there is a timing deviation between the digital codes D30 and D40.

Note that the number of data obtained in a unit time is described as a data rate in the following explanation.

The interpolation circuit 100 performs interpolation on the digital code D40. As a result, the number of the digital codes D40 increases. Therefore, the data rate of the digital codes D40 becomes equal to that of the digital codes D30. The timing deviation of the digital code D30 is adjusted by the timing adjustment circuit 90. The result D90 of the adjustment has the same timing as that of the interpolated data D100 from the interpolation circuit 100.

For this reason, the timing adjusted digital code D90 and the result D100 of interpolation are input to the synthesizer 50 with the same data rate and at the same timing. The synthesizer 50 combines these digital codes and, for example, generates an 11-bit digital code. Note that in actual processing, digital signal processing, for example, rounding, is performed. The 11-bit digital code is converted to a 10-bit digital code and output as the digital code Dout.

As explained above, according to this embodiment, the low-pass filter 20 extracts the low frequency components S20 of the analog signal Vin, and the adder 80 derives the difference of the analog signal Vin and the low frequency signal S20 and outputs the same as the high frequency signal S80. The ADC 30a converts the high frequency signal S80 to the 8-bit digital code D30 while the ADC 40a converts the low frequency signal S20 to the 10-bit digital D40. The timing adjustment circuit 90 adjusts the timing of the digital code D30 and outputs the adjusted digital code D90. The interpolation circuit 100 interpolates the digital code D40 and outputs the digital code D100. The synthesizer 50 combines the digital codes D90 and D100 and outputs the digital code Dout. Therefore, analog-to-digital conversion with a high speed, high precision, and high resolution can be realized.

Third embodiment

Figure 10:
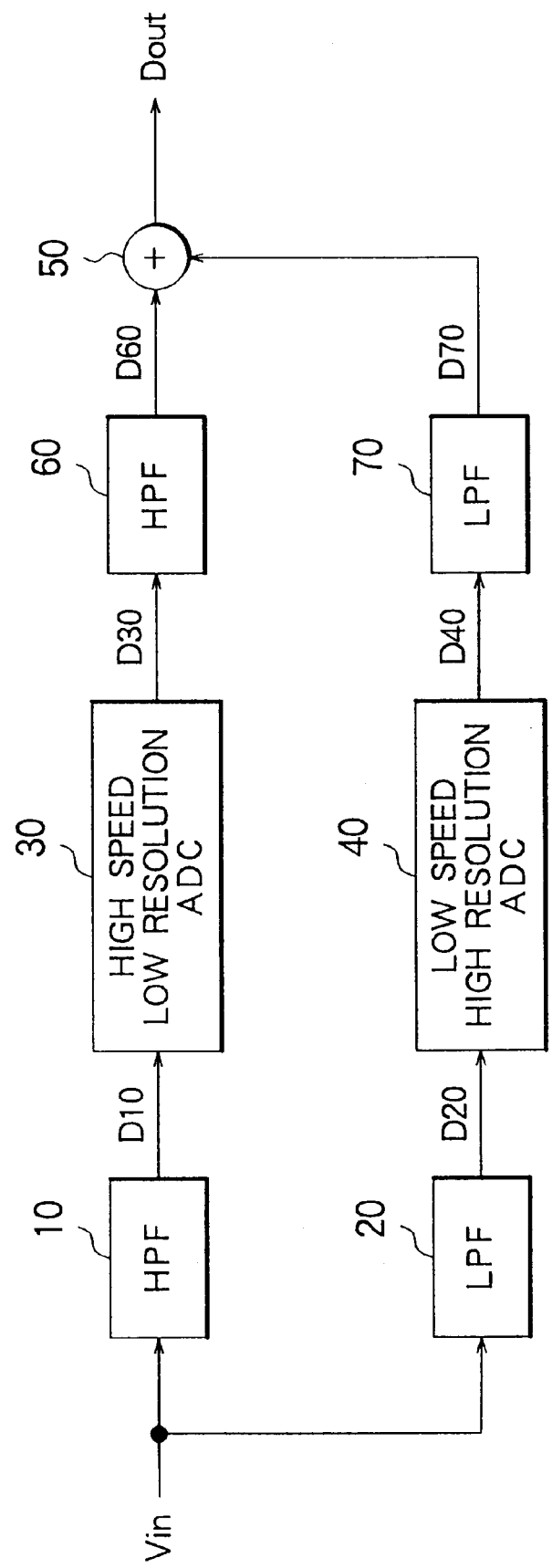
FIG. 10 is a circuit diagram of an analog-to-digital converter according to a third embodiment of the present invention.

FIG. 10 is a circuit diagram of an analog-to-digital converter according to a third embodiment of the present invention.

As illustrated, the analog-to-digital converter of this embodiment is constituted by a high-pass filter 10, a low-pass filter 20, an ADC 30, an ADC 40, a high-pass filter 60, a low-pass filter 70, and a synthesizer 50.

Each of the high-pass filter 10, the low-pass filter 20, and the ADCs 30 and 40 has the same configuration and operation as in the first embodiment shown in FIG. 3, so detailed descriptions of these circuits are omitted here.

In this embodiment, the high-pass filter 60 and the low-pass filter 70 are provided at the output sides of the high speed, low resolution ADC 30 and the low speed, high resolution ADC 40, respectively. Note that the filters are digital filters filtering the output digital codes D30 and D40 from the ADC 30 and 40.

The digital code D30 is generated by the high speed ADC 30 according to the high frequency signal S10. The low frequency components of the quantization noise included in the digital code D30 is attenuated by the high-pass filter 60.

On the other hand, the digital code D40 is generated by the low speed ADC 40 according to the low frequency signal S20. The high frequency noise included in the digital code D40 is attenuated by the low-pass filter 70.

Note that besides attenuating the high frequency noise, the low-pass filter 70 also performs interpolation for the digital code D40 by over sampling. For example, the data rates of the digital codes D30 and D40 obtained from the analog-to-digital converters differs from each other due to the difference of the converting speeds of the ADC 30 and ADC 40. The data rate of the digital code D30 obtained from the high speed ADC 30 is higher than that of the digital code D40 obtained from the low speed ADC 40. For this reason, the output data rate of the output code D60 of the high-pass filter 60 becomes equal to that of the output code D70 of the low-pass filter 70 by the interpolation of the low-pass filter 70.

In this way, the digital codes D60 and D70 having the same data rates are output from the high-pass filter 60 and the low-pass filter 70. These digital codes are input to the synthesizer 50 which then outputs the digital code Dout.

As explained above, according to this embodiment, the analog signal Vin is divided into the high frequency signal S10 and the low frequency signal S20 by the high-pass filter 10 and the low-pass filter 20. The high speed ADC 30 converts the high frequency signal S10 to the digital code D10. The high-pass filter 60 removes the low frequency components of the quantization noise and outputs the digital code D60, while the low speed, high resolution ADC 40 converts the low frequency signal S20 to the digital code D20. The low-pass filter 70 removes the high frequency noise and outputs the digital code D70. The synthesizer 50 combines the digital codes D60 and D70 and outputs the digital code Dout. Therefore, the input analog signal Vin can be converted to a digital code with a high speed and high precision.

Note that, in the above explanation, the interpolation for the output digital code D40 of the ADC 40 is performed by the low-pass filter 70 having the over sampling functions, but the invention is not limited by this. Further, it is preferable to provide a timing adjustment circuit 90 such as that shown in FIG. 9 for compensating for the timing deviation of the output digital code D30 of the ADC 30.

As explained above, according to the analog-to-digital converter of the present invention, the input analog signal is divided into, for example, at least two frequency bands. The divided signals of the frequency bands are converted to digital codes by the analog-to-digital converters. By combining the results of conversion of the frequency bands, analog-to-digital conversion with a high speed and high precision can be realized and digital codes of a high resolution can be obtained.

Further, according to the present invention, the analog-to-digital converter can be formed on an IC easily and the yield of the manufacturing process can be improved.

While the invention has been described with reference to specific embodiments chosen for purposes of illustration, it should be apparent that numerous modifications could be made thereto by those skilled in the art without departing from the basic concept and scope of the invention.

What is claimed is:

1. An analog-to-digital converter outputting a digital signal in response to a level of an input signal, comprising:
   a frequency band divider for dividing the frequency band of the input signal into n (n is an integer equal to or greater than 2) number of frequency bands,
   n number of converters for converting n number of signals of the n number of frequency bands divided by the frequency band divider, each converter converting the corresponding frequency band signal at a frequency corresponding to the frequency band of the input frequency band signal, and
   a synthesizer for combining the n number of results of conversion by the n number of converters and outputting the combined result as one word conversion data for the input signal.

2. An analog-to-digital converter as set forth in claim 1, comprising timing adjustment means for adjusting the timing of the output signal of each converter and outputting the same to the synthesizer.

3. An analog-to-digital converter as set forth in claim 2, wherein each timing adjustment means comprises a delay means for delaying an input signal by a predetermined delay time and outputting the same.

4. An analog-to-digital converter as set forth in claim 1, comprising interpolation means for performing interpolation on the output signal of each converter and outputting the result of the interpolation to the synthesizer.

5. An analog-to-digital converter as set forth in claim 1, wherein the input signal is a video signal comprising a high frequency component that is quantized at a low resolution.

6. An analog-to-digital converter outputting a digital signal in response to a level of an input signal, comprising:
   a band extracting means for extracting predetermined frequency components from the input signal,
   a first converting means for converting a signal of the frequency components extracted by the band extracting means to a first digital signal,
   a second converting means for converting a signal of the remaining frequency components of the input signal to a second digital signal, and
   a synthesizer for combining the first and second digital signals and outputting the combined result as a result of conversion for the input signal.

7. An analog-to-digital converter as set forth in claim 6, wherein the input signal is a video signal comprising a high frequency component that is quantized at a low resolution.

8. An analog-to-digital converter as set forth in claim 6, wherein the band extracting means comprises a low-pass filter for outputting low frequency components of the input signal.

9. An analog-to-digital converter as set forth in claim 6, wherein the first converting means comprises an analog-to-digital converting means having a higher resolution than that of the second converting means.

10. An analog-to-digital converter as set forth in claim 6, wherein the second converting means comprises an analog-to-digital converting means having a higher converting speed than that of the first converting means.

11. An analog-to-digital converter as set forth in claim 6, comprising a timing adjustment means for adjusting the timing of the output signal of the second converting means and outputting the same to the synthesizer.

12. An analog-to-digital converter as set forth in claim 11, wherein the timing adjustment means comprises a delay means for delaying an input signal by a predetermined delay time and outputting the same.

13. An analog-to-digital converter as set forth in claim 6, comprising an interpolation means performing interpolation on the output signal of the first converting means and outputting the result of the interpolation to the synthesizer.

14. An analog-to-digital converter as set forth in claim 6, comprising a high frequency suppressing circuit for attenuating high frequency components of the output signal of the first converting means.

15. An analog-to-digital converter as set forth in claim 6, comprising a low frequency suppressing circuit for attenuating low frequency components of the output signal of the second converting means.

16. An analog-to-digital converter as set forth in claim 6, wherein the band extracting means comprises a high-pass filter for outputting high frequency components of the input signal.

* * * * *